US006411219B1

United States Patent
Slater (10) Patent No.: US 6,411,219 B1
(45) Date of Patent: Jun. 25, 2002

(54) ADAPTIVE RADIO COMMUNICATION FOR A UTILITY METER

(75) Inventor: Byron J. Slater, Lafayette, IN (US)

(73) Assignee: Siemens Power Transmission and Distribution, Inc., Wendell, NC (US)

( * ) Notice: Subject to any disclaimer, the term of this patent is extended or adjusted under 35 U.S.C. 154(b) by 0 days.

(21) Appl. No.: 09/473,788

(22) Filed: Dec. 29, 1999

(51) Int. Cl.[7] .......................... G08B 23/00; G08C 15/06
(52) U.S. Cl. .................................. 340/870.02; 370/437
(58) Field of Search ..................... 340/870.02; 370/437, 370/431, 469, 465, 466

(56) References Cited

U.S. PATENT DOCUMENTS

| | | |
|---|---|---|
| 5,438,329 A | 8/1995 | Gastouniotis et al. |
| 5,451,938 A | 9/1995 | Brennan, Jr. |
| 5,519,387 A | 5/1996 | Besier et al. |
| 5,553,094 A | 9/1996 | Johnson et al. |
| 5,602,744 A | 2/1997 | Meek et al. |
| 5,617,084 A | 4/1997 | Sears |
| 5,619,192 A | 4/1997 | Ayala |
| 5,696,765 A * | 12/1997 | Safadi .......................... 370/436 |
| 5,748,104 A | 5/1998 | Argyroudis et al. |
| 5,801,643 A | 9/1998 | Williams et al. |
| 5,923,269 A | 7/1999 | Shuey et al. |
| 6,041,056 A * | 3/2000 | Bigham et al. ............. 370/395 |

OTHER PUBLICATIONS

"Efforts Target Single–Chip Multiband RF Designs", by Ann R. Thryft, Electronic Engineering Times (Aug. 16, 1999; Issue 1074). No Page No.
"Software Radio's Move to Handset Jolts Regulators", by Loring Wirbel, Electronic Engineering Times (Aug. 16, 1999; Issue 1074).
"Defining Software–Radio Regulations", by John Spicer, Electronic Engineering Times (Aug. 16, 1999; Issue 1074).
"Software Radio Choices Firm Up", by Andrew Burt, Electronic Engineering Times (Aug. 16, 1999; Issue 1074). No Page No.
"Software Radio Key to Compatibility Woes", by Dennis Lunder, Electronic Engineering Times (Aug. 16, 1999; Issue 1074). No Page No.
"Digital IF Fuels Soft Basestations", by David Chester, Electronic Engineering Times (Aug. 16, 1999; Issue 1074). p. 77.
"IF Filter Strategies Back Integration", by Simon White, Electronic Engineering Times (Aug. 16, 1999; Issue 1074). p. 80 & 90.
"Multimode Receiver Uses IF Sampling", by Dimitrios Efstathio, Electronic Engineering Times (Aug. 16, 1999; Issue 1074). No Page No.
"RF Services Simplify With 'Soft' Radio", by Ravi Subramanian, Electronic Engineering Times (Aug. 16, 1999; Issue 1074).
"Soft RF: New Frontier For Hackers", by Tom Kean, Electronic Engineering Times (Aug. 16, 1999; Issue 1074). No Page No.
"Dual–Mode Route To Low–Cost RF", by Gerry Stanton, Electronic Engineering Times (Aug. 16, 1999; Issue 1074). p. 96.

* cited by examiner

Primary Examiner—Timothy Edwards, Jr.

(57) ABSTRACT

A method, apparatus, and system are disclosed for providing communication between a utility meter and a remote station via any of a plurality of RF modulation schemes and communication protocols over any of a plurality of carrier frequencies. The utility meter includes adaptive radio circuitry that is preferably programmably configured to receive and process any format of incoming signals, and generate and send any format of outgoing signals. The adaptive radio circuitry includes a DSP, filters, an analog-to-digital converter, a digital-to-analog converter, a tunable broadband up/down converter and other processing circuitry. A main processor and memory provides control over the adaptive radio module.

13 Claims, 4 Drawing Sheets

ADAPTIVE RADIO COMMUNICATION FOR A UTILITY METER

BACKGROUND OF THE INVENTION

1. Field of the Invention

The present invention relates to utility meters and, more particularly, to utility meters capable of communicating meter data to a remote location.

2. Description of the Prior Art

Utility meters are commonplace with regard to measuring utility or commodity consumption or usage (e.g. electricity, gas, water, and the like) for billing the consumer. Such utility meters are interposed between the source of the utility and the usage point. The utility meters are generally located proximate the area of usage of the commodity and, in the case of electricity meters, are typically mounted on a side of the structure in which the electrical energy is consumed. Because the cost of the commodity to the consumer is determined in part by usage, the metered amount of consumption of the commodity must be communicated to the utility service provider.

Various techniques have been developed to communicate data from utility meters that measure commodity usage at utility customer sites. Historically, meters have been read manually by human "meter readers" who traveled from meter site to meter site. In such techniques, the meter reading data may be written down by the meter reader or inputted manually into an electronic data collection device. However, manual reading has substantial labor costs and is vulnerable to transportation problems, truancy, and human error. In view of the above, various techniques have been developed to alleviate the problems.

One technique for remote meter data collection is to utilize hardwired electronic communications systems (such as telephone lines) to transmit meter data to remote monitor stations. Such systems, however, require dedicated line connections that can increase meter installation costs, and, for example, in the case of telephone lines, rely on the specifications and dependability of communications networks over which the utility supplier has little of not control.

Another technique for remote meter data collection employs radio frequency (RF) communications between meters and remote monitor stations. A problem with prior art RF communications techniques is that no standard, universal communication system has been adopted. Accordingly, different utility service providers may adopt any one of various RF communications technologies, such as Itron, Cell Net, RAMAR, etc., that utilize various frequency modulation and protocol schemes. As a result, meter manufacturers must specifically adapt meters to accommodate the RF communications schemes of particular utility service providers. In particular, manufacturers must equip each meter with a radio that is specifically adapted to communicate using the communication system employed by the utility service provider. The process of equipping separate meters with diverse radio equipment increases manufacturing and logistical costs.

It would thus be desirable for a utility meter to be capable of sending and/or receiving meter data within a plurality of RF communication schemes.

It would also be desirable for a utility meter to be capable of transmitting and/or receiving meter data and the like without requiring each meter to be specifically adapted to the particular communication scheme used by the utility service provider that purchases the meter.

SUMMARY OF THE INVENTION

The present invention, in one form, is a utility meter having an adaptive radio that provides communication between the utility meter and a remote station via any of a plurality of RF modulation schemes and communication protocols over any of a plurality of carrier frequencies.

According to one embodiment, a utility meter has an adaptive radio module that includes processing circuitry, memory, an analog-to-digital (A/D) converter, a digital-to-analog (D/A) converter, filters, a tunable broad band up/down converter (UDC), and an RF antenna. The adaptive radio module is preferably configured to send and/or receive data and is electronically coupled to controlling and monitoring circuitry of the meter.

In operation, the RF antenna receives and transmits RF waves, and is operationally connected to the UDC. For reception of communications (such as a request for data) from the remote station, the UDC scans a plurality of RF carrier frequencies for communications to the meter from the remote station. The communications may be in any one of a plurality of combinations of modulation schemes and communications protocols. Output signals from UDC are filtered, digitized by the A/D converter, and then demodulated by the processing circuits. The signal processing capabilities of a digital signal processor (DSP) provides demodulation of a plurality of modulation schemes.

In one form, the DSP is operable to be self-configurable to effectuate any one of a plurality of demodulation schemes and any one of a plurality of communication protocols. Transmissions of communications from the utility meter to the remote station are conversely accomplished in any of a plurality of modulation schemes and any one of a plurality of communications protocols.

The present invention, in another form, provides a method of providing communication between a utility meter and a remote station via an adaptive radio that communicates with a remote station via any of a plurality of RF modulation schemes and communications protocols over any of a plurality of carrier frequencies.

As a result, the present utility meter with an adaptive radio provides communications between the utility meter and a remote station via any of a plurality of RF modulation schemes and communications protocols over any of a plurality of carrier frequencies. The use of the adaptive radio reduces, if not eliminates, the need to specially configure each meter for the specific RF communication techniques employed by the system in which the meter is used.

BRIEF DESCRIPTION OF THE DRAWINGS

The above-mentioned and other features and advantages of this invention, and the manner of attaining them, will become more apparent and the invention will be better understood by reference to the following description of an embodiment of the invention taken in conjunction with the accompanying drawings, wherein.

Corresponding reference characters indicate corresponding parts throughout the several views. The exemplification set out herein illustrates one preferred embodiment of the invention, in one form, and such exemplification is not to be construed as limiting the scope of the invention in any manner.

DETAILED DESCRIPTION OF THE INVENTION

Figure 1:
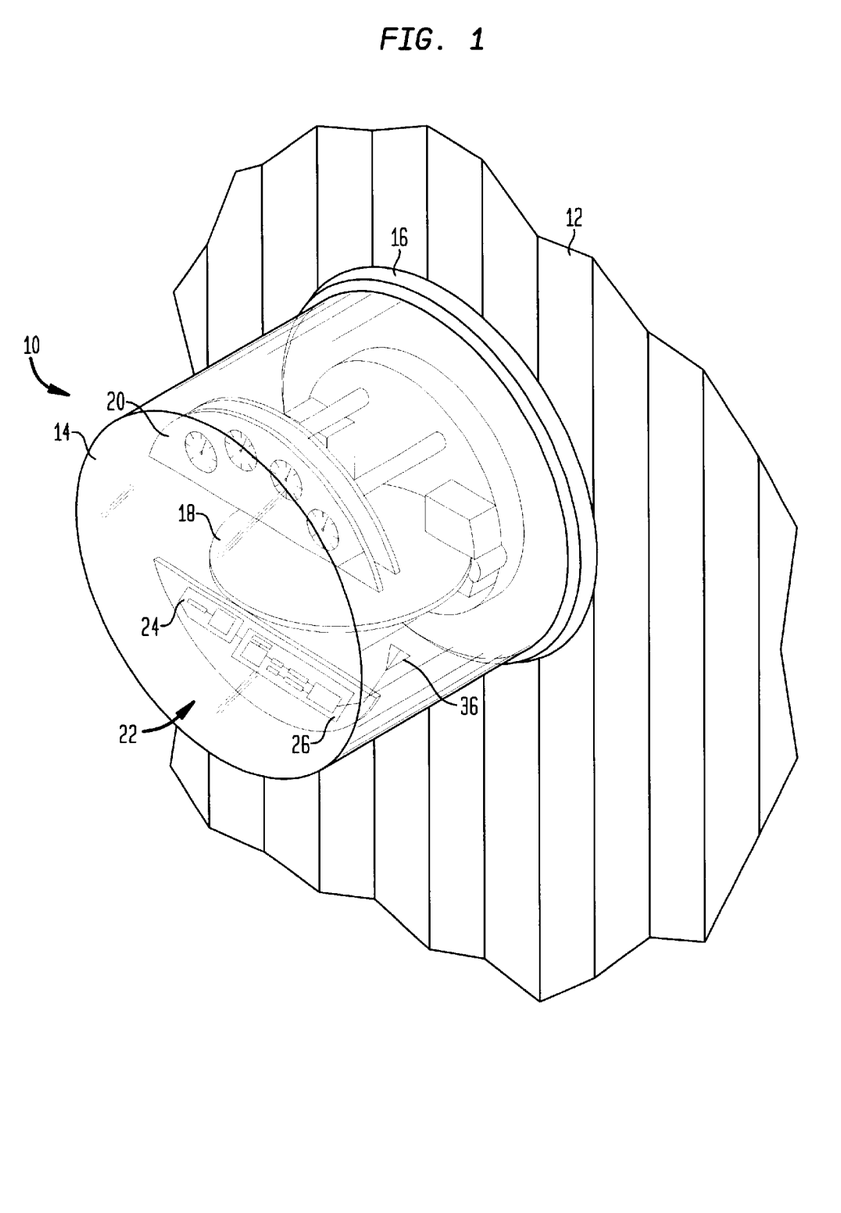
FIG. 1 is a front perspective view of a utility (electricity) meter having an adaptive radio therein in accordance with the principles of the present invention.

With reference now to FIG. 1 there is depicted a utility meter 10. While utility meter 10 is depicted in FIG. 1 as an electricity or watt-hour meter, it should be appreciated that the present invention is not limited to electricity meters, but is applicable to all types of utility meters and thus hereafter will be termed "meter." Meter 10 is mounted to a wall 12 that is typically the outside of a residence or other building but may be any structure at any location. Meter 10 includes a cover 14 typically made from glass or a suitable plastic. The cover 14 is secured to a base plate 16 that is attached to the wall 12 and houses the various components typical of an electricity meter.

Particularly, the meter 10 depicted in FIG. 1 is a rotating disk type electricity meter characterized by a rotating disk 18, dial face plate 20 on which is mounted several dials that visually indicate the total kilowatt-hours of electricity that has been used, and other components typical of an electricity meter as is known in the art. The meter 10 has a processing unit 22 that is in communication with the various components of the meter 10 so as to receive information regarding usage and electricity supply characteristics/parameters from the various components. According to an aspect of the present invention, the processing unit 22 includes processor board 24 and adaptive radio module or circuitry 26 that is in communication with the processor board 24. The adaptive radio circuitry 26 may be a separate module that is adapted to interface with a processing unit of a utility meter, or as part of a processing unit of a utility meter.

As is known in the art, the several dials on faceplate 20 indicate accumulated watt-hours of electricity used. The meter-reader typically reads the dials on the faceplate 20 in order to determine the amount of energy consumed by the customer. Other parameters for various statistics may also be gathered by the meter 10. In this regard, the processing unit 22 can perform the necessary data processing to obtain or calculate any such parameters. Since the processing unit 22 is electronic, it should be appreciated that faceplate 20 may be an electronic display such as an LCD display or the like rather than the analog dials.

It should also be appreciated that the utility meter 10 may as well be an electronic or solid state (digital) type utility meter as is known in the art in addition to the analog utility meter as depicted in FIG. 1. In the case of a solid state meter, the processor board 24 of the processing unit 22 would typically be part of a main processing unit or controller board that is typically a part of an electronic meter. The adaptive radio module 26 is then in communication with the processing unit or controller board. One example of an electronic meter which may be employed is the meter 10 described in U.S. patent application Ser. No. 08/690,973 which is assigned to the assignee of the present invention and specifically incorporated herein by reference.

Figure 2:
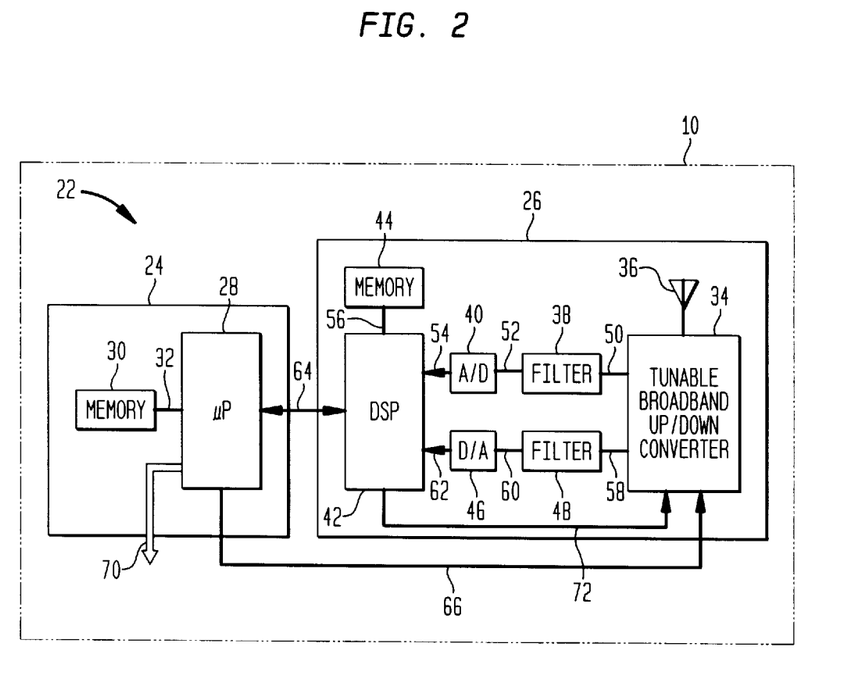
FIG. 2 is a block diagram of the utility meter of FIG. 1 particularly showing the adaptive radio module in communication with processor board 24.

With reference to FIG. 2, there is shown a block diagram of the adaptive radio module 26 and at least a portion of the processor board 24 of processing unit 22. Processor board 24 includes a microprocessor ("µP") 28 that is in communication with memory 30 via data communication line 32. It should be understood that the term data communication line, or any similar term may encompass all types of data and/or communication links that enables the transfer of such data/communications from one device to another device.

The memory 30 may be in addition to any memory on or integral with the microprocessor 28 and can comprise any known memory devices such as RAM, ROM, EEPROM, or the like. The memory 30 stores instructions that are executed by the microprocessor 28. The instructions or logic may comprise a software program or subroutine for control or regulation of the various aspects of the present invention as well as the utility meter in general.

Arrow 70 emanating from the microprocessor 28 represents connection and/or communication with other typical components of a processing unit for a utility meter. For example, arrow 70 may represent a connection to electronic energy consumption measurement circuits, not shown, that perform measurements and generate the energy consumption within the meter. Such circuits are well-known and may include voltage and current sensors, analog to digital converters, and digital signal processing circuitry. In addition, arrow 70 may represent a communications port for connection to peripherals, modems and the like. Power for the processing unit 22 is supplied by known power means in a manner known in the art.

Generally, the present adaptive radio module 26 is configured and operable to receive RF signals comprising one or a plurality of frequencies within a band or bands of frequencies. The various frequencies are particular or common to those used for RF communications. Adaptive radio module 26 includes a tunable broad band up/down converter 34 that is in communication with an antenna 36.

The antenna 36 is adapted to send and receive broad band RF signals as is known in the art. The antenna 36 may be part of the module board or a separate structure. If the antenna 36 is a separate structure, it may be disposed within the meter housing or outside thereof. The choice of location of the antenna 36 is dependent upon various factors such as location, terrain, and expected frequencies that will be used.

The broad band up/down converter 34 is tunable through external control such as that provided by the microprocessor 28 via the communication line 66 and/or the DSP 42 via the communication line 72. Depending on the instructions performed by the microprocessor 28 and/or the DSP 42 the broad band up/down converter 34 can tune a wide range of RF signals received by the antenna 36 such as those typically used for communications. Moreover, the broad band up/down converter 34 is further operable to downconvert the RF signals to intermediate frequency (IF) signals that are more easily processed. As well, the broad-band up/down converter 34 can process IF signals generated by the present adaptive radio module 26 and upconvert the IF signals to appropriate RF signals for transmission by the antenna 36. Preferably, the DSP 42 is operable to tune the broad-band up/down converter 34 in both the receive and transmit modes.

The broad band up/down converter 34 is in communication with a filter 38 via communication line 50 such that IF signals generated by the broad band up/down converter 34 are provided to the filter 38. The filter 38 is preferably a band-pass type filter tuned for the various downconverted IF signals received from the broad-band up/down converter 34 and has a low Q (energy in/energy out) and an anti-aliasing function. The filter 38 is in communication via communication line 52 with an analog-to-digital (A/D) converter 40 for digitizing the IF signals passed by the filter 38.

The A/D converter 40 samples the incoming analog IF signals outputted from the filter 38 preferably above the Nyquist sampling rate for passband bandwidth. The output digital signal from the A/D converter 40 is sent to a preferably programmable digital signal processor (DSP) 42 via communication line 54. The A/D converter 40 is adapted to capture all intermediate frequencies and all types of modulations in the IF bandwidth.

The DSP 42 receives the output signals from the A/D converter 40 and processes them in accordance with instructions stored in the memory 44. The instructions include various algorithms necessary for demodulating the various known modulation schemes and protocol schemes.

For example, the memory 44 may include algorithms that allow the DSP 42 to perform modulation and demodulation using Frequency Shift Keying ("FSK") techniques, Quadrature Amplitude Modulation ("QAM") techniques, Quadrature Phase Shift Keying ("QPSK"), and others. Likewise, the memory 44 may include algorithms that allow the DSP 42 to communicate demodulated digital signals using Manchester encoding protocols, Hamming protocols, and other well-known communication and/or error correction protocols (e.g. Reed-Solomon). Such algorithms would be known to those in the art.

The DSP 42 also controls the various frequencies and/or channels being received and processed by the adaptive radio module 26 and any additional filtering as necessary. The received and demodulated signals are communicated to the microprocessor 28 via communication line 64 to be used, stored, and/or processed by the processing unit 22. The incoming signals may include instructions (e.g. software), polling, and the like. The memory 44 is in addition to any memory integral with the DSP 42 and may be any type of memory such as RAM or ROM.

The DSP 42 is also adapted to generate IF signals from base-band signals received through the microprocessor 28. As well, the DSP 42 may generate IF signals from instructions from the microprocessor 28. Such base-band signals could include information such as watt-hours used, voltage and current information, diagnostic information, and the like for transmission by the adaptive radio module 26. The information signals to be transmitted may be in response to polling (received signals) or as a regular or scheduled transmission.

A digital-to-analog (D/A) converter 46 is in communication with the DSP 42 via communication line 62 for converting digital IF signals from the DSP 42 into IF analog signals. The D/A converter 46 is in communication with a filter 48 via communication line 60. The filter 48 is preferably a band-pass type filter tuned for the various generated analog IF frequencies received from the D/A converter 46 and has a low Q (energy in/energy out) and an anti-aliasing function. The filter 48 is in communication with the broadband up/down converter 34 via communication line 58 that upconverts the analog IF signal received from the filter 48 into RF signals for transmission by the antenna 36.

The DSP 42 is adapted to allow multiple and/or simultaneous receipt and/or transmission of RF signals/channels depending on the communication line or bus used for communication between the various components. The various modulation schemes and communications protocols used for the received signals and the signals to be transmitted are stored as known algorithms and used by the DSP 42 for signal processing. Additional or any type of modulation scheme and/or communication protocol may be stored in memory 44 and accessible by the DSP 42 and received by the adaptive radio module 26 through an RF transmission.

In the context of receiving RF signals, the tunable broad band up/down converter 34 can convert a whole band or bands of RF signals, but does not demodulate the incoming RF signals. In the context of sending RF signals, the tunable broad band up/down converter 34 can convert a whole band or bands of RF signals, but does not modulate the outgoing RF signal. The DSP 42 performs all IF modulation and demodulation in accordance with the selected modulation and protocol schemes. Of course, the modulation and protocol schemes of an incoming RF signal is fixed by the transmitter, but is deciphered by the present adaptive radio module 26. The modulation and protocol scheme for transmission may be any one of the many modulation and protocol schemes. Transmission and reception schemes do not have to be the same. The DSP 42 also performs filtering to channel and frequency, and allows multiple simultaneous radio communication channels.

Figure 3:
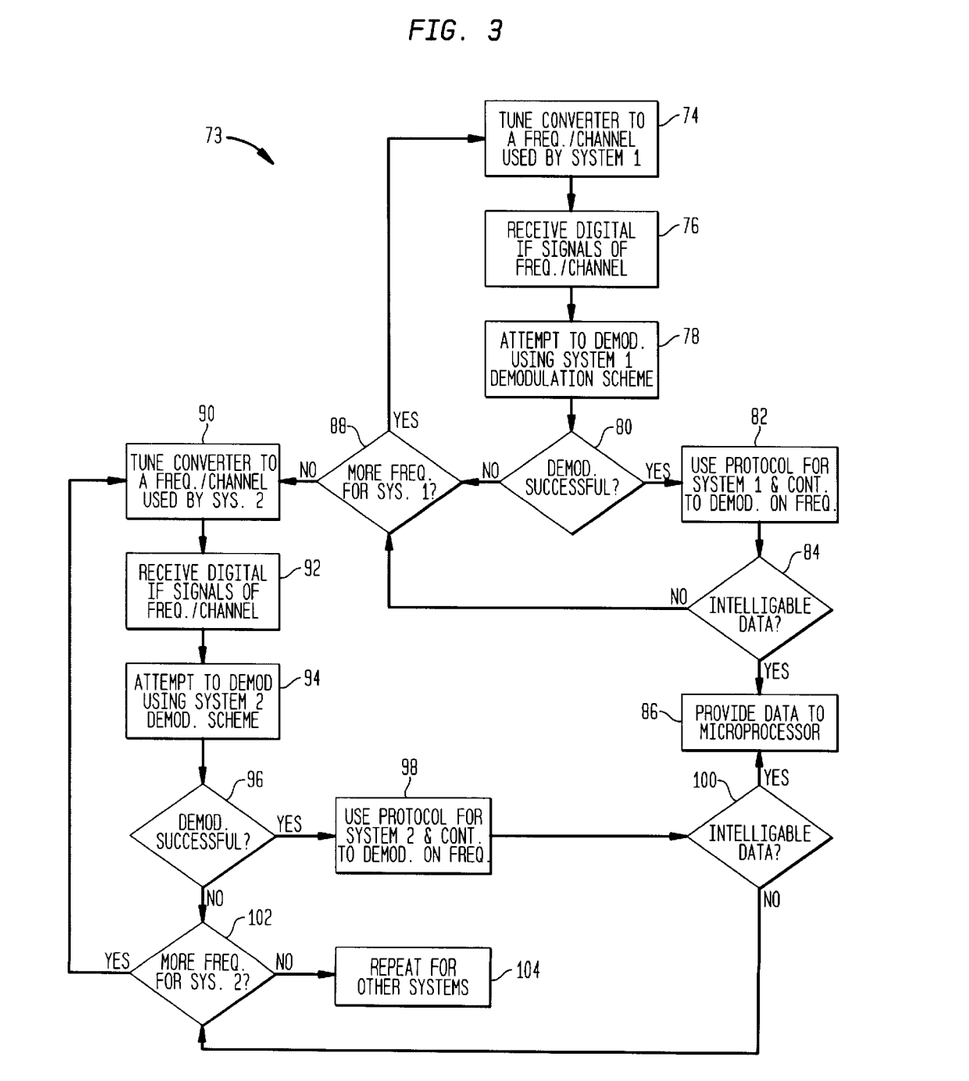
FIG. 3 is a flowchart of general DSP operation for incoming signals.
Figure 4:
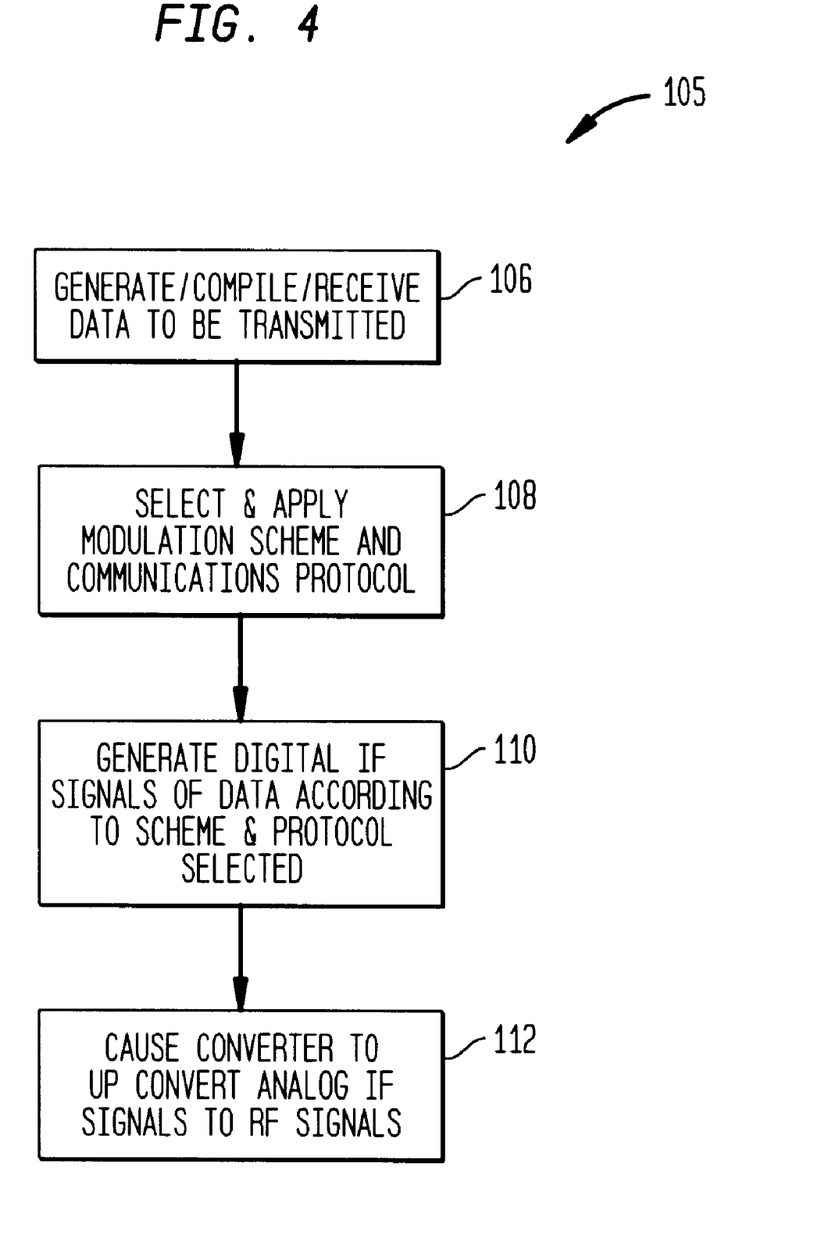
FIG. 4 is a flowchart of general DSP operation for outgoing signals.

FIGS. 3 and 4 illustrate in further detail operation of the adaptive radio module 26, particularly the DSP 42, in an exemplary implementation of the present invention. FIG. 3 shows a signal receiving routine of the adaptive radio module 26. FIG. 4 shows a signal transmitting routine of the adaptive radio module 26. It should be understood that the adaptive radio module 26 only transmits information when polled through a received transmission or when scheduled, such as at various set and/or random intervals.

In connection with FIGS. 3 and 4, it is noted that the DSP 42 (and more particularly, the memory 44) is preferably programmed with information regarding a plurality of RF communication schemes known to be in use by various utility service providers. Such information preferably includes the combination of modulation/demodulation algorithms and communication protocols associated with each RF communication scheme. Such information may further include, for each RF communication scheme, i) the channel frequencies used in the RF communication scheme, and ii) data protocols employed by the communication scheme.

With reference now to FIG. 3, there is shown flowchart 73 generally showing operation of the DSP 42 in a signal receiving mode. In step 74, the DSP 42 causes the up/down converter 34 to tune to a frequency or channel of a plurality of various possible radio frequencies or channels via communication line 72. The choice of what frequency to tune may be dependent upon the modulation scheme/communication protocol. In particular, the various modulation schemes and associated communication protocols are stored in the memory 44 associated with the DSP 42. Each modulation scheme/communication protocol and may be defined as a System. In step 74, the DSP 42 chooses "System 1" and tunes to a frequency used by that particular System. The signal is converted into a digital intermediate frequency (IF) signal by the up/down converter 34, filtered by filter 38 and digitized by the A/D converter 40. In step 76, the now digital IF signal is received by the DSP 42 for processing. The DSP 42 attempts to demodulate the digital IF signal according the modulation characteristics of System 1, step 78, and then determines if the demodulation is successful, step 80. Successful demodulation causes the DSP 42 to use or apply the communication protocol for System 1 to the signals, and continue to keep the converter 34 tuned to the particular frequency and demodulate the signals, step 82. The DSP 42 further checks to determine whether the demodulated, protocol decoded signal contains intelligible data, step 84. If the signal does not contain intelligible data, the program goes to step 88. If the signal does contain intelligible data, that data is provided to the microprocessor 28, step 86. If intelligible data is found, the adaptive radio 26 thereafter applies the relevant modulation scheme and communication protocol to the incoming data/signal.

Unsuccessful demodulation of the signal using System 1, as determined in step 80 causes the DSP 42 to determine whether there are other frequencies available for possible demodulating using System 1, step 88. If it is determined that there are additional frequencies to try, there is a return to step 74 using one of those frequencies. If it is determined by the DSP 42 in step 88 that there are no additional frequencies, the DSP 42 causes the up/down converter 34 to tune to a frequency or channel of the plurality of frequencies or channels used by System 2, step 90.

In step 90, the received signal is converted into a digital intermediate frequency (IF) signal by the up/down converter 34, filtered by filter 38 and digitized by the A/D converter 40. In step 92, the digital IF signal is received by the DSP 42 for processing. The DSP 42 attempts to demodulate the digital IF signal according the modulation characteristics of System 2, step 94, and then determines if the demodulation is successful, step 96. Successful demodulation causes the DSP 42 to use or apply the communication protocol for System 2 to the signals, and continue to keep the converter 34 tuned to the particular frequency and demodulate the signals, step 98. The DSP 42 further checks to determine whether the demodulated, protocol typed signal contains intelligible data, step 100. If the signal does not contain intelligible data, there is a return to step 102. If the signal does contain intelligible data, that data is provided to the microprocessor 28, step 86.

Unsuccessful demodulation of the signal using System 2, as determined in step 96 causes the DSP 42 to determine whether there are other frequencies available for possible demodulating using System 2, step 102. If it is determined that there are additional frequencies to try, steps 90 through 96 are repeated. If it is determined by the DSP 42 in step 102 that there are no additional frequencies, the DSP 42 causes the up/down converter 34 to tune to a frequency or channel of the plurality of frequencies or channels used by other Systems. The number of demodulation attempts is governed by whether demodulation is successful and/or the total number of Systems (i.e. modulation schemes/communication protocols) are stored.

It should be understood that the various modulation/demodulation schemes or algorithms are stored in memory 44, and thus the number of attempts to demodulate the incoming signal by the DSP 42 depends on the number of stored modulation/demodulation schemes and/or algorithms or Systems.

Thus, as discussed above in connection with FIG. 3, the adaptive radio module 26 is self-configurable in the receiving mode to identify the modulation scheme and communication protocol used by the network in which the meter 10 is installed. Since it is unlikely that there would be several different types of modulation schemes and communications protocols being transmitted to the meter 10 at any one time, the adaptive radio module 26 maintains the up/down converter 34 tuned to the particular frequency/channel until 1) no intelligent data is thereafter received (as periodically determined), 2) the frequency/channel is changed by incoming data, or 3) a periodic check determines a change.

Typically, a utility company will use only a single modulation scheme and communication protocol from a plurality of available modulation schemes and communications protocols. Therefore it is not necessary for the DSP 42 to continuously scan the various frequencies once a particular signal has been successfully demodulated and protocol typed and determined to contain data for the meter 10. However, several cases warrant continuous determination of an intelligent signal. In a first case, if several signals are being transmitted for reception by the meter 10 on different frequencies or channels, the DSP 42 would control the up/down converter 34 via communication line 72 to tune to the particular frequencies for processing. In a second case, if several signals are being transmitted in different modulation schemes and/or communications protocols, the DSP 42 would concurrently provide the demodulated and protocol typed signal to the microprocessor 28 for processing. As well, various "frequency hopping" or "frequency skipping" transmission schemes (e.g. spread spectrum) may also be employed which would be recognized by the DSP 42 and action taken accordingly.

It is further preferable in the case where the adaptive radio module 26 locates a signal, successfully demodulates the signal and determines its protocol, then self-configures to utilize the successful demodulation scheme/communication protocol, that the adaptive radio module 26 is operable to periodically check the modulation scheme and communication protocol being used against the incoming signal. The check may be performed monthly, for example, in order to determine if the adaptive radio module 26 needs to be reconfigured or regularly as during signal reception. As well, if there are no current intelligent signals being received by the meter 10, the adaptive radio module 26 may enter a continuous scan mode for any such signals. Such periodic transmission may be scheduled and thus the adaptive radio module 26 may only tune or scan at a predetermined time for a predetermined time period.

With reference now to FIG. 4, there is shown flowchart 105 generally showing operation of the DSP 42 in a signal transmitting mode. The DSP 42 generates data, or compiles and/or receives data from the microprocessor 28 to be transmitted, step 106. The data is typically commodity usage information in various forms, but may include meter performance data, operating characteristics and the like. Once the data has been compiled by the DSP 42, a modulation scheme and communications protocol are selected and applied to the data, step 108. The selection of the modulation scheme and communications protocol may be 1) arbitrary, 2) according to the modulation scheme and communications protocol of any incoming data, or 3) according to other criteria. The DSP 42 selects the modulation scheme and communications protocol from those stored in memory 44.

After modulation and protocol selection, step 108, the DSP 42 generates digital IF signals accordingly, step 110, that are converted into analog IF signals by D/A converter 46, filtered by filter 48, and received by up/down converter 34. Thereafter, the DSP 42 causes the up/down converter 34 to upconvert the analog IF signals into analog RF signals for transmission, step 112. The choice of which frequency or channel on which to transmit may be 1) arbitrary, 2) according to the frequency/channel of any incoming signal, or 3) according to other criteria. The DSP 42 may select the frequency/channel from those stored in memory 44.

The DSP 42 is operable to receive multiple channels/frequencies of variously modulated, protocol coded signals while generating and transmitting multiple channels/frequencies of variously modulated and protocol decoded signals. As well, transmission of signals may be accomplished during a time when there are no incoming signals.

It is further more noted that the adaptive radio 26 may be adapted to new modulation schemes and communication protocols by reprogramming the memory 44 with the appropriate algorithms. As a result, the adaptive radio 26 need not be replaced to accommodate new data transmission schemes. The present adaptive radio 26 is operable to allow the change of the communications bandwidths, frequencies, and modulation schemes that can be received and transmitted by merely modifying the software/firmware thereof. Thus, a single meter incorporating the present adaptive radio 26 may be manufactured and used in any location with any communication system.

It should also be appreciated that the algorithm of FIG. 3 may not necessarily be implemented by the DSP 42. If the adaptive radio 26 is programmed to receive a particular one of the various modulation schemes/communications protocols, it is not necessary to determine the modulation scheme and communications protocol being used. This information may be preprogrammed into the memory 44 or may be sent to the adaptive radio 26. In this case, the a priori nature of knowing the modulation scheme/communications protocol obviates the need for the algorithm of FIG. 3. Of course, the modulation scheme and communications protocol may be changed due to the adaptive/configurable nature of the present adaptive radio 26.

While this invention has been described as having a preferred design, the present invention can be further modified within the spirit and scope of this disclosure. This application is therefore intended to cover any variations, uses, or adaptations of the invention using its general principles. Further, this application is intended to cover such departures from the present disclosure as come within known or customary practice in the art to which this invention pertains and which fall within the limits of the appended claims.

For example, while the exemplary embodiment of the adaptive radio described above includes a digital signal processor, it is noted that the phrase "digital signal processor" shall encompass other types of processors and/or combinations of discrete circuitry and processing circuitry may be adapted to carry out the salient operations described above in connection with the digital signal processor. Moreover, it is noted that the RF receiver circuitry is in no way limited to the configuration of the broad-band up/down converter, filter, antenna and A/D conversion circuitry described above. Any RF receiver circuitry operable to receive broadband RF signals and provide digitized IF signals to the processing circuitry of the adaptive radio may be used as the RF receiver circuitry of the adaptive radio.

What is claimed is:

1. A utility meter, comprising:
   a housing;
   a processing unit within said housing; and
   an adaptive radio within said housing and electronically coupled to said processing unit, said adaptive radio configured to receive RF signals according to any one of a plurality of modulation schemes and communication protocols via any one of a plurality of carrier frequencies, and send RF signals according to one of a plurality of modulation schemes and communications protocols via any one of a plurality of carrier frequencies.

2. The utility meter of claim 1, wherein said adaptive radio comprises:
   an RF receiver circuit configured to receive RF signals and generate digital IF signals therefrom; and
   a digital signal processor operable to receive the digital IF signals and generate data signals using one of a plurality of modulation schemes and communication protocols.

3. The utility meter of claim 2, wherein said digital signal processor is self-configurable to employ a select modulation scheme and a select communication protocol.

4. The utility meter of claim 1, wherein said adaptive radio comprises:
   a digital signal processor adapted to generate outgoing digital IF signals according to one of a plurality of modulation schemes and communications protocols and adapted to demodulate and organize an incoming digital IF signal;
   an antenna;
   a broad-band up/down converter electronically coupled to said antenna and adapted to downconvert incoming analog RF signals received by said antenna to incoming analog IF signals for processing, and to upconvert outgoing analog IF signals generated by said digital signal processor to outgoing analog RF signals for transmission by said antenna;
   a first filter electronically coupled to said broad-band up/down converter and adapted to filter the incoming analog IF signals;
   an analog-to-digital converter electronically coupled to said first filter and to said digital signal processor and adapted to convert the filtered incoming analog IF signals to incoming digital IF signals;
   a digital-to-analog converter electronically coupled to said digital signal processor and adapted to convert outgoing digital IF signals from said digital signal processor to outgoing analog IF signals; and
   a second filter electronically coupled between said digital-to-analog converter and said broad-band up/down converter and adapted to filter the outgoing analog IF signals.

5. The utility meter of claim 4, wherein said processing unit includes a microprocessor, and said broad-band up/down converter is tunable and in communication with said microprocessor.

6. The utility meter of claim 4, wherein said digital signal processor is self-configurable.

7. The utility meter of claim 4, further comprising:
   a memory device electronically coupled to said digital signal processor and having a plurality of instructions stored therein that are executable by said digital signal processor.

8. A utility meter, comprising:
   a housing;
   utility controlling and monitoring circuitry within said housing; and
   adaptive radio circuitry within said housing and electronically coupled to said utility controlling and monitoring circuitry and an RF antenna, the adaptive radio circuitry operable to send and/or receive RF signals in any one of a plurality of RF modulation/demodulation schemes and communication protocols via any one of a plurality of carrier frequencies and including,
   a broad band up/down converter electronically coupled to said RF antenna and operable to convert incoming analog RF signals received by said RF antenna to incoming analog IF signals, and convert outgoing analog IF signals generated by the adaptive radio circuitry to outgoing analog RF signals;
   a first filter electronically coupled to said broad band up/down converter and operable to receive and filter the incoming analog IF signals;
   an analog-to-digital converter electronically coupled to said first filter and operable to digitize the incoming analog IF signal from said first filter into incoming digital IF signals;

a digital signal processor electronically coupled to said analog-to-digital converter and operable to receive and demodulate the incoming digital IF signals from said analog-to-digital converter, said digital signal processor further operable to generate and modulate outgoing digital IF signals;

a digital-to-analog converter electronically coupled to said digital signal processor and operable to convert the outgoing digital IF signals into outgoing analog IF signals; and a second filter electronically coupled between said digital-to-analog converter and said broad band up/down converter and operable to receive and filter the outgoing analog IF signals.

9. The utility meter of claim 8, wherein said utility controlling and monitoring circuitry includes a microprocessor, and said broad band up/down converter is tunable and in communication with said microprocessor.

10. The utility meter of claim 8, wherein said digital signal processor is self-configurable.

11. The utility meter of claim 8, further comprising:

a memory device electronically coupled to said digital signal processor and having a plurality of instructions stored therein that are executable by said digital signal processor.

12. A method of communicating between a utility meter having controlling and monitoring circuitry therein and a remote station, the remote station configured to transmit and receive RF signals according to any one of a plurality of modulation schemes and communication protocols via any one of a plurality of carrier frequencies, the method of communicating comprising the steps of:

receiving said RF signals;

down-converting the RF signals to generate IF signals;

providing digitized IF signals to a digital signal processor; and employing the digital signal processor to demodulate the IF signals in accordance with a select modulation scheme and generate data therefrom using a select communication protocol.

13. The method of claim 12 further comprising the steps of:

employing a digital signal processor to generate digital IF signals using the select modulation scheme and the select communication protocol;

converting the digital IF signal to an analog RF signal; and transmitting the analog RF signal.

\* \* \* \* \*